United States Patent
Mihira

(10) Patent No.: US 9,646,805 B2
(45) Date of Patent: May 9, 2017

(54) FOCUSED ION BEAM SYSTEM AND METHOD OF MAKING FOCAL ADJUSTMENT OF ION BEAM

(71) Applicant: JEOL Ltd., Tokyo (JP)

(72) Inventor: Tomohiro Mihira, Tokyo (JP)

(73) Assignee: JEOL Ltd., Tokyo (JP)

( * ) Notice: Subject to any disclaimer, the term of this patent is extended or adjusted under 35 U.S.C. 154(b) by 216 days.

(21) Appl. No.: 14/533,494

(22) Filed: Nov. 5, 2014

(65) Prior Publication Data
US 2015/0136978 A1    May 21, 2015

(30) Foreign Application Priority Data

Nov. 13, 2013  (JP) ................................ 2013-234900

(51) Int. Cl.
*H01J 37/28*     (2006.01)
*H01J 37/153*    (2006.01)
(Continued)

(52) U.S. Cl.
CPC ............ *H01J 37/304* (2013.01); *H01J 37/21* (2013.01); *H01J 37/28* (2013.01); *H01J 37/3005* (2013.01); *H01J 2237/0492* (2013.01); *H01J 2237/08* (2013.01); *H01J 2237/10* (2013.01); *H01J 2237/21* (2013.01); *H01J 2237/216* (2013.01); *H01J 2237/2448* (2013.01);
(Continued)

(58) Field of Classification Search
CPC ...... H01J 37/3056; H01J 37/28; H01J 37/153; H01J 37/21; H01J 37/10; H01J 37/12; H01J 37/222; H01J 37/263; H01J 37/3007

USPC .... 250/306, 307, 492.2, 310, 492.1, 492.21, 250/396 R, 397
See application file for complete search history.

(56) References Cited

U.S. PATENT DOCUMENTS 4,710,639 A * 12/1987 Sawaragi ............ H01J 37/3171
                                                        250/398
4,804,840 A *  2/1989 Ichihashi ................ H01J 37/21
                                                        250/310
(Continued)

FOREIGN PATENT DOCUMENTS

JP           200048756 A     2/2000

*Primary Examiner* — David A Vanore
(74) *Attorney, Agent, or Firm* — The Webb Law Firm

(57) ABSTRACT

A focused ion beam system is offered which can make a focal adjustment without relying on the structure of a sample while suppressing damage to the sample to a minimum. Also, a method of making this focal adjustment is offered. The focused ion beam system has an ion source for producing an ion beam, a lens system for focusing the beam onto the sample, a detector for detecting secondary electrons emanating from the sample, and a controller for controlling the lens system. The controller is operative to provide control such that the sample is irradiated with the ion beam without scanning the beam and that a focus of the ion beam is varied by varying the intensity of the objective lens during the ion beam irradiation. Also, the controller measures the intensity of a signal indicating secondary electrons emanating from the sample while the intensity of the objective lens is being varied. Furthermore, the controller makes a focal adjustment of the ion beam on the basis of the intensity of the objective lens obtained when the measured intensity of the signal indicating secondary electrons is minimal.

4 Claims, 4 Drawing Sheets

(51) Int. Cl.
*H01J 37/304* (2006.01)
*H01J 37/21* (2006.01)
*H01J 37/30* (2006.01)

(52) U.S. Cl.
CPC ............... *H01J 2237/30472* (2013.01); *H01J 2237/31749* (2013.01)

(56) References Cited

U.S. PATENT DOCUMENTS

| | | | | |
|---|---|---|---|---|
| 4,952,803 | A * | 8/1990 | Matsuda | H01J 49/32 250/296 |
| 6,177,670 | B1 * | 1/2001 | Sugiyama | G01N 23/225 250/307 |
| 6,476,398 | B1 * | 11/2002 | Xu | H01J 37/21 250/396 R |
| 8,698,105 | B2 * | 4/2014 | Ogawa | H01J 37/28 250/306 |
| 2004/0227099 | A1 * | 11/2004 | Matsuya | H01J 37/28 250/398 |
| 2005/0167607 | A1 * | 8/2005 | Hosokawa | H01J 37/153 250/396 R |
| 2006/0289801 | A1 * | 12/2006 | Matsuba | G01N 1/32 250/492.21 |
| 2010/0116984 | A1 * | 5/2010 | Ogawa | H01J 37/28 250/307 |
| 2015/0136978 | A1 * | 5/2015 | Mihira | H01J 37/3005 250/307 |

* cited by examiner

| Beam Currnt (nA) | Accelerating voltage (kV) | |
|---|---|---|
| | 30 | 10 |
| 50 | C' | E' |
| 20 | B' | D' |
| 10 | A' | 0 |
| 5 | 0 | 0 |

FOCUSED ION BEAM SYSTEM AND METHOD OF MAKING FOCAL ADJUSTMENT OF ION BEAM

BACKGROUND OF THE INVENTION

Field of the Invention

The present invention relates to a focused ion beam system for directing a focused ion beam at a sample or a workpiece to process it and also to a method of making a focal adjustment of the ion beam.

Description of Related Art

A known technique for making a focal adjustment in a focused ion beam system consists of varying the amount of adjustment of a beam optical system to produce various states, taking and displaying final images of a sample under these states, and repeating an operation for selecting a clear image, thus adjusting the focus (see, for example, JP-A-2000-048756). Another known technique for making a focal adjustment consists of selecting a signal arising from edge structures of a sample and determining a focal position at which the signal becomes sharpest.

In the above-described known method, it is necessary to scan the surface of a sample with an ion beam in order to obtain a final image and, therefore, etching of the ion beam damages a wide area on the sample. In the known method employing a signal arising from edge structures has the problem that a focal adjustment cannot be made unless any structure exists on the sample.

SUMMARY OF THE INVENTION

In view of the problems described so far, the present invention has been made. According to some aspects of the invention, it is possible to offer a focused ion beam system capable of making a focal adjustment without depending on the structure of the sample while suppressing damage to the sample to a minimum. Also, a method of making a focal adjustment of the ion beam in this focused ion beam system is offered.

(1) The present invention provides a focused ion beam system for irradiating a sample or a workpiece with a focused ion beam to process the sample. The focused ion beam system has an ion source for producing the ion beam, a lens system for focusing the ion beam onto the sample, a detector for detecting secondary electrons emanating from the sample, and a controller for controlling the lens system. The controller provides control such that the sample is irradiated with the ion beam without scanning the beam and that a focus of the ion beam is varied by varying the intensity of an objective lens during the ion beam irradiation. While the intensity of the objective lens is being varied, the intensity of a signal indicating secondary electrons emanating from the sample is measured. A focal adjustment of the ion beam is made on the basis of the intensity of the objective lens obtained when the measured intensity of the signal indicating secondary electrons is minimal.

Furthermore, the invention provides a method of making a focal adjustment of an ion beam in a focused ion beam system. The method starts with irradiating a sample or a workpiece with the ion beam without scanning the beam. While the sample is being irradiated with the ion beam, the intensity of an objective lens is varied to thereby vary the focus of the ion beam. The intensity of a signal indicating secondary electrons produced from the sample while the intensity of the objective lens is being varied is measured. A focal adjustment of the ion beam is made on the basis of the intensity of the objective lens obtained when the measured intensity of the signal indicating secondary electrons is minimal.

According to the present invention, the sample or workpiece is irradiated with the ion beam without scanning the beam, and a focal adjustment is made based on the intensity of the signal indicating secondary electrons emanating from the sample while the intensity of the objective lens is being varied. Thus, damage to the sample caused by the ion beam irradiation is suppressed to a minimum. Furthermore, the focal adjustment can be made without regard to the structure of the sample.

(2) In one feature of the focused ion beam system and method of making a focal adjustment of the ion beam associated with the present invention, the controller makes a focal adjustment during processing of the sample on the basis of the intensity of the objective lens obtained when the measured intensity of the signal indicating secondary electrons is minimal. The controller may make a focal adjustment during processing of the sample on the basis of a value that is offset a given value from the intensity of the objective lens obtained when the measured intensity of the signal indicating secondary electrons is minimal.

According to the present invention, an optimum focal adjustment can be made during processing of a sample or a workpiece. Also, an optimum focal adjustment can be made during imaging of the sample.

(3) In another feature of the focused ion beam system and method of making a focal adjustment of the ion beam associated with the present invention, the controller may provide control such that astigmatism in the ion beam is varied by varying the intensity of a stigmator during the irradiation by the ion beam. The intensity of the signal indicating secondary electrons emanating from the sample is measured while the intensity of the stigmator is being varied. A stigmatic correction of the ion beam may be made on the basis of the intensity of the stigmator obtained when the measured intensity of the signal indicating secondary electrons is minimal.

According to the present invention, the sample is irradiated with the ion beam without scanning the beam, and a stigmatic correction is made based on the intensity of the signal indicating secondary electrons emanating from the sample while the intensity of the stigmator is being varied. This minimizes damage to the sample caused by the ion beam irradiation. Furthermore, a stigmatic correction can be made without relying on the structure of the sample.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. Configuration

Figure 1:
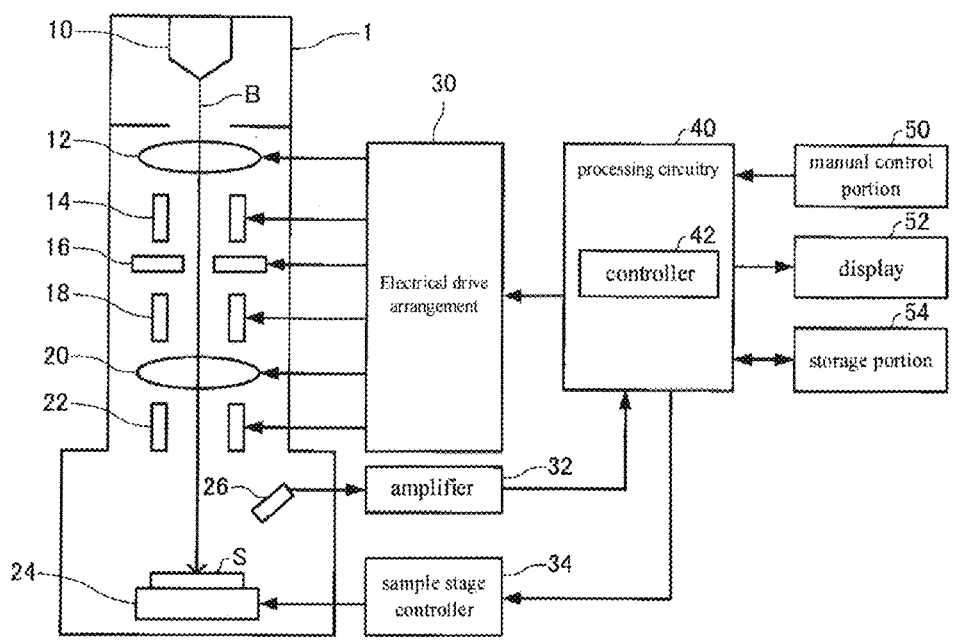
FIG. 1 is a schematic vertical cross section, partly in block form, of a focused ion beam system associated with one embodiment of the present invention.

FIG. 1 shows one example of the configuration of a focused ion beam system associated with one embodiment of the present invention. Note that some components of the focused ion beam system shown in FIG. 1 may be omitted.

As shown in FIG. 1, the focused ion beam system includes a body 1, an electrical drive arrangement 30, an amplifier 32, a sample stage controller 34, processing circuitry 40, a manual control portion 50, a display device 52, and a storage portion 54. The body 1 of the focused ion beam system includes an ion source 10, condenser lenses 12, a blanker 14, a movable aperture 16, a stigmator 18, an objective lens 20, a deflector 22, a sample stage 24, and a detector 26.

The ion source 10 produces an ion beam B, which is extracted from the ion source 10 by an extractor electrode (not shown) and accelerated by an accelerating electrode (not shown). The condenser lenses 12 focus the ion beam B produced by the ion source 10. The blanker 14 blanks the ion beam B. The movable aperture 16 selectively limits the amount of current of the ion beam B. The stigmator 18 shapes the cross-sectional shape of the beam B to make the cross section of the impinging beam circular. The beam B is focused onto the surface of a sample or workpiece S by the objective lens 20. The deflector 22 causes the ion beam B focused by the objective lens 20 to be scanned over the sample S. The sample stage 24 moves the sample S horizontally or vertically and rotates or tilts the sample S.

The detector 26 detects secondary electrons emanating from the sample S in response to the irradiation by the beam B. The detector 26 produces an output signal indicating the intensity of the secondary electrons. The output signal is amplified by the amplifier 32 and then supplied to the processing circuitry 40.

The electrical drive arrangement 30 drives the condenser lenses 12, blanker 14, movable aperture 16, stigmator 18, objective lens 20, and deflector 22 in response to a control signal produced from the processing circuitry 40. The stage controller 34 controls the operation of the sample stage 24 in response to another control signal produced from the processing circuitry 40.

The manual control portion 50 permits a user to enter manual control information. The manual control portion 50 outputs the entered manual control information to the processing circuitry 40. The function of the manual control portion 50 may be implemented by hardware such as a keyboard, a mouse, buttons, a touch panel display, or the like.

An image (such as a secondary electron image of the sample S based on the scanning of the focused ion beam B) created by the processing circuitry 40 is displayed on the display device 52. The function of the display device can be implemented by an LCD, a CRT, or the like.

Programs and various data permitting a computer to operate as various portions of the processing circuitry 40 are stored in the storage portion 54. The storage portion 54 acts as a working area for the processing circuitry 40. The function of the processing circuitry 40 can be implemented by a hard disc, a RAM, or the like.

The processing circuitry 40 operates to control the electrical drive arrangement 30 and the stage controller 34. Furthermore, the processing circuitry 40 operates to synchronize the output signal from the amplifier 32 with a scanning signal for the ion beam B, the scanning signal being supplied to the deflector 22, and to generate image data representing a secondary electron image. The functions of the processing circuitry 40 can be implemented by hardware (such as various processors (e.g., a CPU, a DSP, or the like) or an ASIC (such as a gate array)) or software. The processing circuitry 40 includes a controller 42.

The controller 42 generates a control signal and sends it to the electrical drive arrangement 30 to control the lens system including the condenser lenses 12, blanker 14, movable aperture 16, stigmator 18, objective lens 20, and deflector 22.

During a focal adjustment, the controller 42 of the present embodiment provides control to irradiate the sample S with the ion beam B without scanning the beam and varies the intensity of the objective lens 20 during irradiation by the beam B, thus varying the focus of the beam B. Furthermore, when the intensity of the objective lens 20 is being varied, the controller 42 detects the intensity of a signal indicating secondary electrons emanating from the sample S, and makes a focal adjustment of the ion beam B, based on the intensity of the objective lens 20 obtained when the detected intensity of the signal indicating secondary electrons is minimal. That is, the intensity of the objective lens 20 occurring when the detected intensity of the signal indicating secondary electrons is minimal is taken as the intensity of the objective lens 20 under a focused condition. Alternatively, the controller 42 may make a focal adjustment during processing of the sample or workpiece, based on the intensity of the objective lens 20 occurring when the detected intensity of the signal indicating secondary electrons is minimal. During observation of the sample or workpiece, the controller 42 may make a focal adjustment, based on a value offset a given value from the intensity of the objective lens 20 obtained when the detected intensity of the signal indicating secondary electrons is minimal.

During a stigmatic correction, the controller 42 provides control to irradiate the sample S with the ion beam B without scanning the beam and to vary the intensity of the stigmator 18 during the irradiation by the beam B, thus varying the astigmatism in the beam B. In addition, the controller 42 detects the intensity of the signal indicating secondary electrons produced from the sample S while the intensity of the stigmator 18 is being varied, and makes a stigmatic correction of the ion beam B, based on the intensity of the stigmator 18 occurring when the detected intensity of the signal indicating secondary electrons is minimal. That is, the intensity of the stigmator 18 occurring when the detected intensity of the signal indicating secondary electrons is minimal is taken as the intensity of the stigmator 18 used when astigmatism is corrected. Alternatively, the controller 42 may make a stigmatic correction during processing of the sample or workpiece, based on the intensity of the stigmator 18 obtained when the detected intensity of the signal indicating secondary electrons is minimal, and may make a stigmatic correction during observation of the sample, based on a value offset a given value from the intensity of the stigmator 18 obtained when the detected intensity of the signal indicating secondary electrons is minimal.

2. Technique of the Present Embodiment

Figure 2:
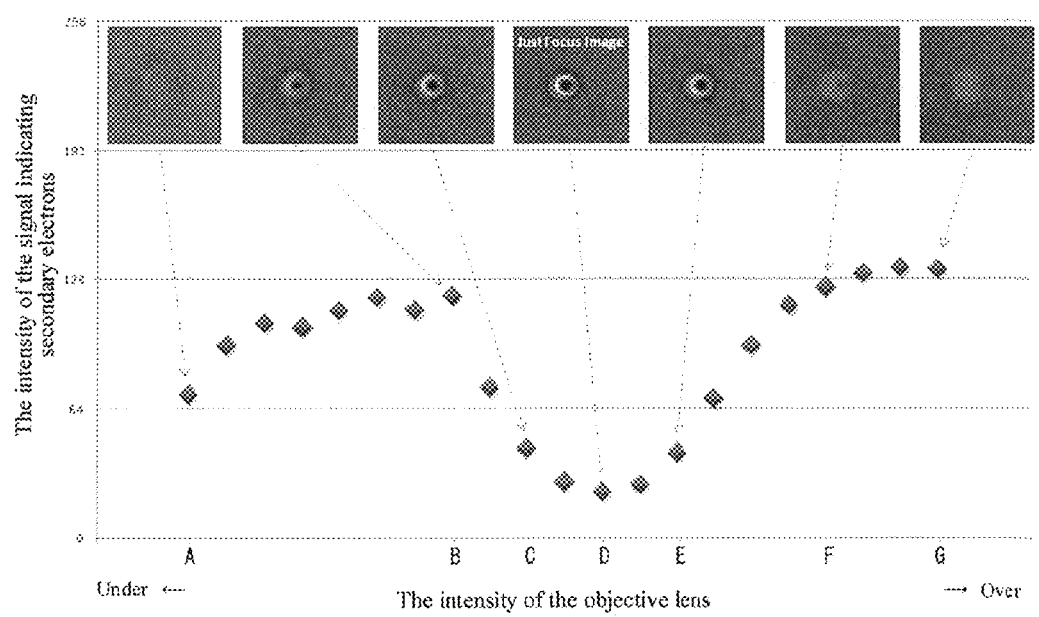
FIG. 2 is a graph showing variations in the intensity of a signal indicating secondary electrons measured when a sample is irradiated with a low-current ion beam and the intensity of the objective lens shown in FIG. 1 is varied.

The technique of the present embodiment is next described by referring to FIGS. 1 and 2.

In the technique of the focal adjustment of the present embodiment, the surface of the sample S is irradiated with the ion beam without scanning the beam. The focus of the ion beam is continuously varied while varying the intensity of the objective lens 20 during ion beam irradiation. The intensity of the signal indicating secondary electrons emanating from the sample S is measured while the intensity of the objective lens 20 is being varied. Thus, a focal adjustment is made.

FIG. 2 shows variations of the intensity of a signal indicating secondary electrons measured when a low-current ion beam was directed at a sample and the intensity of the objective lens was varied. FIG. 2 also shows secondary electron images taken when the intensity of the objective lens (i.e., the applied voltage) was adjusted to A, B, C, D, E, F, and G, respectively.

As shown in FIG. 2, the variations in the intensity of the signal indicating secondary electrons describe a downwardly convex curve having a valley. The intensity of the objective lens corresponding to this valley of the curve is obtained when the objective lens is in a focused condition. That is, the intensity of the objective lens obtained when the measured intensity of the signal indicating secondary electrons is minimal is the intensity of the objective lens under a focused condition. In the example shown in FIG. 2, the intensity of the objective lens corresponding to the minimum level of the intensity of the signal indicating secondary electrons is D. It can be seen that the secondary electron image obtained at this time is best focused and that the intensity of the objective lens corresponding to the minimum level of the intensity of the signal indicating secondary electrons gives a focused condition.

If an ion beam is directed as a spot beam at the sample surface without scanning the beam, atoms at the surface of the sample are kicked off, forming holes in the surface of the sample. When the ion beam is better focused, the holes formed in the sample surface become thinner and deeper. If an ion beam having a sufficiently small probe diameter enters such thin and deep holes, the intensity of the signal indicating secondary electrons emanating from the sample decreases. The technique of the present embodiment takes notice of this phenomenon, i.e., as the ion beam impinging on the sample surface is better focused, the intensity of the signal indicating secondary electrons produced from the sample decreases. The sample surface is irradiated with an ion beam without scanning the beam while varying the intensity of the objective lens. A focal adjustment is made based on the intensity of the objective lens obtained when the measured intensity of the signal indicating secondary electrons is minimal.

According to the technique of the present embodiment, the ion beam can be focused without scanning the beam over the sample and, therefore, during a focal adjustment, damage to the sample due to the ion beam irradiation can be suppressed to a minimum. Furthermore, the time taken to scan the beam is dispensed with. Consequently, a focal adjustment can be performed in a short time. In addition, if there is no edge structure on the sample, the ion beam can be focused. Hence, a focal adjustment can be made without relying on the structure of the sample.

Figure 3:
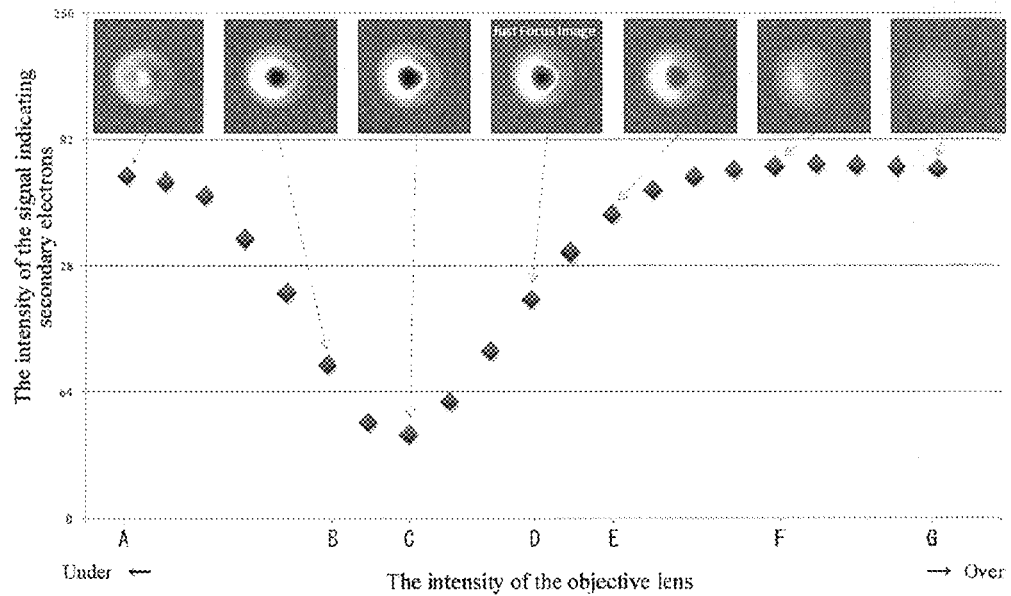
FIG. 3 is a graph showing variations in the intensity of the signal indicating secondary electrons measured when the sample is irradiated with a large-current ion beam and the intensity of the objective lens is varied.

FIG. 3 shows variations in the intensity of a signal indicating secondary electrons measured when an ion beam of a large current (10 nA or higher in this example) was directed at a sample and the intensity of the objective lens was varied. FIG. 3 also shows secondary electron images taken when the intensity of the objective lens (applied voltage) was adjusted to A, B, C, D, E, F, and G, respectively.

In the example shown in FIG. 3, in the same way as in the example shown in FIG. 2, a curve representing variations in the intensity of a signal indicating secondary electrons is downwardly convex and has a valley. The intensity of the objective lens corresponding to this valley of the curve is the intensity of the objective lens under an exactly focused condition. In the example shown in FIG. 3, the intensity of the objective lens corresponding to the valley of the curve representing variations in the intensity of the signal indicating secondary electrons is C and denotes a correctly focused condition. In the example shown in FIG. 3, a secondary electron image obtained when the intensity of the objective lens assumes a value corresponding to the valley of the curve representing variations in the signal indicating secondary electrons is C is not focused. Rather, a secondary electron image obtained when the intensity of the objective lens D is best focused. This indicates that, in the example shown in FIG. 3, the position of the valley of the curve representing variations in the intensity of the signal indicating secondary electrons indicates a focal point during processing of a sample, not a focal point during imaging of the sample. This means that there is a deviation between a focal point occurring during processing of a sample and a focal point occurring during imaging in a case where the sample is irradiated with an ion beam of a large current.

Figure 4:
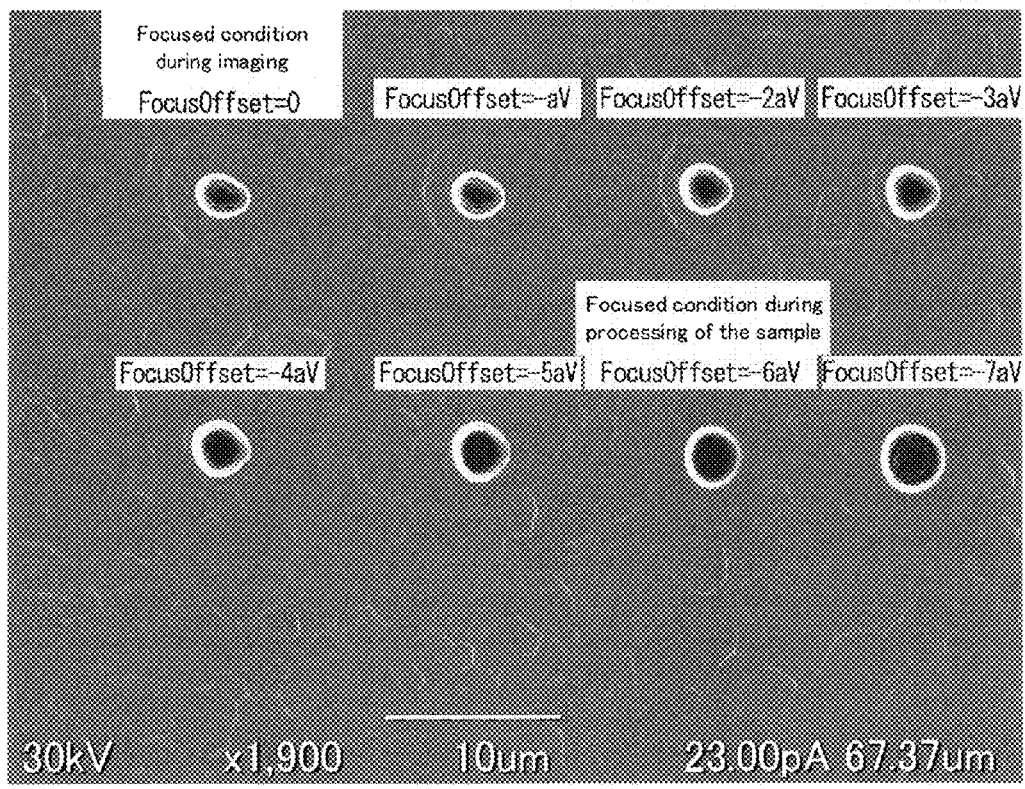
FIG. 4 shows secondary electron images indicating holes formed by performing spot ion-beam lithography with various focal values.

FIG. 4 shows secondary electron images indicating holes left when spot ion-beam lithography was done by irradiating a sample with an ion beam of a large current adjusted to various focal values without scanning the beam. First, the focal value of the ion beam was set in conformity with a focal condition assumed during imaging of the sample and the sample was processed by the spot ion-beam lithography. Then, the sample was processed similarly by ion-beam lithography while decrementing the focal value (the intensity of the objective lens) by aV. Since the holes were formed as a result of the spot ion-beam lithography, variations in gray level showing the holes represent a distribution of current densities of the ion beam.

It can be seen from FIG. 4 that the central portion of the beam is most sharply focused under a focused condition during imaging and that there are many scattering components of the beam around the central portion. If the central portion of the beam is narrowed down to a small area, the beam becomes adapted for imaging but the current density in the central portion of the beam decreases. Therefore, it is impossible to form deep holes and thus the beam is not suited for processing of the sample (see (A) of FIG. 5).

It is seen that when the focal value was decremented from a value obtained under a focused condition during imaging, the central portion of the beam gradually thickened but the region of the scattering components of the beam narrowed. This increased the current density in the central portion of the beam, making it possible to form deep holes. The beam became adapted for processing of the sample (see (B) of FIG. 5). A focal value at which the region of the scattering components of the beam has disappeared indicates a focused condition during processing of the sample. This coincides with the valley of the curve representing variations in the intensity of the signal indicating secondary electrons shown in FIG. 3. In the example shown in FIG. 4, a value offset a given amount of −aV from a value corresponding to a focal condition occurring during imaging indicates a focused condition occurring during processing of the sample. In other words, a value offset +6 aV from the value corresponding to the focal condition during processing of the sample gives a focal condition during imaging of the sample.

Figures 5, 6:
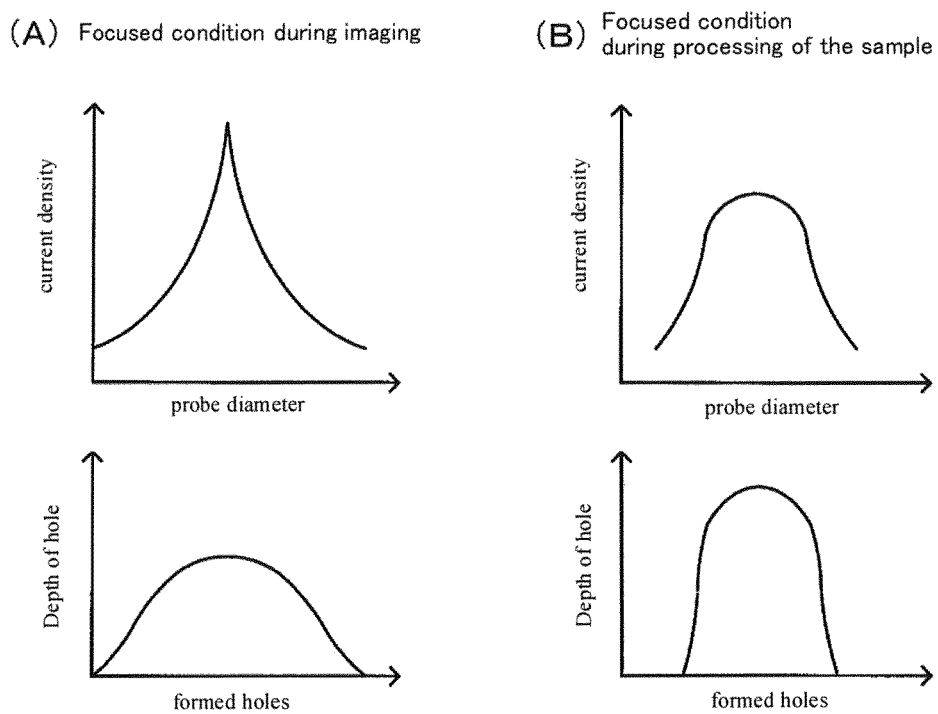
FIG. 5 shows graphs representing relationships between a current density distribution of a beam and a distribution of depths of formed holes.
FIG. 6 is a table of offset amounts corresponding to various values of current and accelerating voltage.

Accordingly, when a sample or workpiece is processed using an ion beam of a large current, a focal adjustment is made such that the intensity of the objective lens corresponding to the valley of the curve representing variations in the intensity of the signal indicating secondary electrons is taken as indicating a focused condition, in the same way as in the case where an ion beam of a low current is used. Where the sample is imaged (i.e., to obtain a secondary image of the sample) using an ion beam of a large current, a focal adjustment may be made using a value offset a given value from the intensity of the objective lens corresponding to the valley position of the curve representing variations in the signal indicating secondary electrons as a value indicating a focused condition. The amount of offset (decremental amount) is previously measured and stored as a parameter intrinsic to the system in the storage portion 54. Since the amount of offset varies depending on the current of the ion beam and on the accelerating voltage, amounts of the offset corresponding to various combinations of the values of the current and accelerating voltage are previously measured and stored as data elements of a table in the storage portion 54 as shown in FIG. 6. When a focal adjustment is made, offset amounts corresponding to set values of current and accelerating voltage are read from this table, and a focal adjustment adapted for imaging of the sample is carried out. In this way, the technique of the present embodiment makes it possible to perform a focal adjustment adapted for processing of a sample and a focal adjustment adapted for imaging on the basis of the intensity of the objective lens obtained when the intensity of the signal indicating secondary electrons is minimal.

A stigmatic correction of an ion beam can be made by a technique similar to the above-described focal adjustment. In particular, the surface of the sample S is irradiated with an ion beam without scanning the beam. During the ion beam irradiation, the intensity of the stigmator 18 is varied to change the astigmatism in the ion beam continuously. While the intensity of the stigmator 18 is being varied, variations in the intensity of a signal indicating secondary electrons emanating from the sample S are measured, thus performing the stigmatic correction. That is, a stigmatic correction is made such that the intensity of the stigmator 18 corresponding to the minimum value of the curve representing variations in the intensity of the signal indicating secondary electrons is taken as the intensity of the stigmator 18 used during correction of the astigmatism. Furthermore, when a sample is imaged and observed using an ion beam of a large current, a stigmatic correction is made such that a value offset a given amount from the intensity of the stigmator 18 corresponding to the minimum value of the curve representing variations in the intensity of secondary electrons is taken as the intensity of the stigmator 18 used during correction of astigmatism. In this way, according to the technique of the present embodiment, even when astigmatism is corrected, damage to the sample due to ion beam irradiation can be suppressed to a minimum. In addition, a stigmatic correction can be made in a short time without relying on the structure of the sample.

3. Operation

Figure 7:
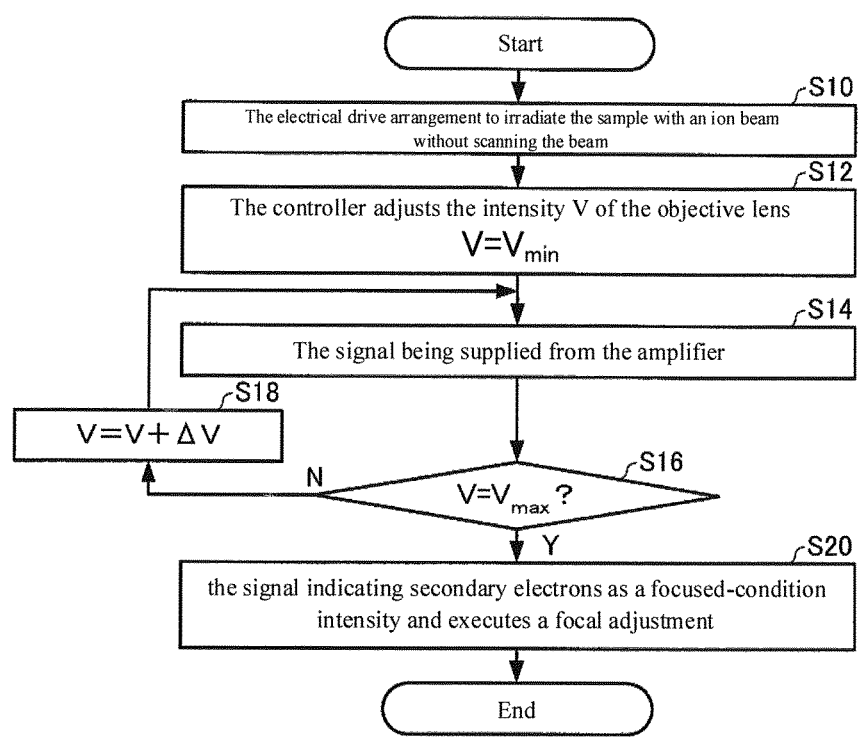
FIG. 7 is a flowchart illustrating one example of subroutine for making a focal adjustment in the focused ion beam system shown in FIG. 1.

One example of the operation of the focused ion beam system of the present embodiment to make a focal adjustment is next described by referring to the flowchart of FIG. 7.

First, the controller 42 controls the electrical drive arrangement 30 to irradiate the sample with an ion beam without scanning the beam (step S10). The position of the beam on the sample is determined by moving the sample stage 24 based on manual control information from the manual control portion 50.

Then, the controller 42 adjusts the intensity V (applied voltage) of the objective lens 20 to a given minimum value $V_{min}$ and varies (step S12). The intensity V of the objective lens 20 is varied from the given minimum value $V_{min}$ to a maximum value $V_{max}$. This range is determined according to the set value of accelerating voltage of the ion beam.

The controller 42 then obtains a signal indicating the intensity of a signal indicating secondary electrons, the signal being supplied from the amplifier 32 (step S14). The obtained signal intensity of secondary electrons is correlated with the intensity V of the objective lens 20 produced at this time, and is stored in the storage portion 54.

The controller 42 then makes a decision as to whether the current value of the intensity V of the objective lens 20 has reached the given maximum value $V_{max}$ (step S16). If the decision at step S16 is No, indicating that the maximum value $V_{max}$ is not reached, the intensity V of the objective lens 20 is incremented by a given value $\Delta V$ ($\Delta V < V_{max} - V_{min}$) (step S18). Control then goes to step S14. Steps S14-S18 are repeated until the intensity V of the objective lens 20 reaches the maximum value $V_{max}$.

If the decision at step S16 is Yes, indicating that the intensity V of the objective lens 20 has reached the maximum value $V_{max}$, the controller 42 sets the intensity of the objective lens corresponding to a minimum value of the obtained intensity of the signal indicating secondary electrons as a focused-condition intensity and executes a focal adjustment (step S20). Where a focal adjustment is carried out during processing of the sample, an offset amount is read from the table as shown in FIG. 6 at step S20. The focal adjustment is performed while taking a value offset from the intensity of the objective lens occurring when the intensity of the signal indicating secondary electrons is minimal as a focused-condition intensity, based on the obtained offset amount.

Alternatively, at step S12, the intensity V of the objective lens may be set to the maximum value $V_{max}$. At step S16, a decision may be made as to whether the intensity V of the objective lens has reached the minimum value $V_{min}$. At step S18, the intensity V of the objective lens 20 may be decremented by the given value $\Delta V$.

4. Modifications

It is to be noted that the present invention is not restricted to the above embodiment but rather various changes and modifications are possible. The present invention embraces configurations (e.g., configurations identical in function, method, and results or identical in purpose and advantageous effects) which are substantially identical to the configurations described in the above embodiment. Furthermore, the invention embraces configurations which are similar to the configurations described in the above embodiment except that their nonessential portions have been replaced. Additionally, the invention embraces configurations which are identical in advantageous effects to, or which can achieve the same object as, the configurations described in the above embodiment. Further, the invention embraces configurations which are similar to the configurations described in the above embodiment except that a well-known technique is added.

For instance, in the description of the above embodiment, a focal adjustment of an ion beam is made while varying the intensity of the objective lens. Alternatively, a focal adjustment of an ion beam may be made while varying the intensity of a focus lens equipped in a focused ion beam system.

Having thus described my invention with the detail and particularity required by the Patent Laws, what is desired protected by Letters Patent is set forth in the following claims:

The invention claimed is:

1. A focused ion beam system for irradiating a sample or a workpiece with a focused ion beam to process the sample, said focused ion beam system comprising:
   an ion source for producing the ion beam;
   a lens system including a focusing lens for focusing the ion beam onto the sample;
   a detector for detecting secondary electrons emanating from the sample; and
   a controller for controlling the lens system;
   wherein said controller is operative to provide control such that the sample is irradiated with the ion beam without scanning the beam and that a focus of the ion beam is varied by stepwise varying the intensity of the focusing lens during the ion beam irradiation, to measure the intensity of a signal from the detector indicating the intensity of secondary electrons emanating from the sample while the intensity of the focusing lens is being stepwise varied, and to make a focal adjustment of the ion beam on the basis of the intensity of the focusing lens obtained when the measured intensity of the signal indicating secondary electrons is minimal.

2. The focused ion beam system as set forth in claim 1, wherein said controller makes a focal adjustment during processing of the sample on the basis of the intensity of the focusing lens obtained when the measured intensity of the signal indicating secondary electrons is minimal, and wherein said controller makes a focal adjustment during processing of the sample on the basis of a value that is offset a given value from the intensity of the focusing lens obtained when the measured intensity of the signal indicating secondary electrons is minimal.

3. The focused ion beam system as set forth in claim 1, wherein said controller is operative to provide control such that astigmatism in the ion beam is varied by varying the intensity of a stigmator during the irradiation by the ion beam, to measure the intensity of the signal indicating secondary electrons emanating from the sample while the intensity of the stigmator is being varied, and to make a stigmatic correction of the ion beam on the basis of the intensity of the stigmator obtained when the measured intensity of the signal indicating secondary electrons is minimal.

4. A method of making a focal adjustment of an ion beam in a focused ion beam system, said method comprising the steps of:
   irradiating a sample or a workpiece with the ion beam without scanning the beam;
   varying a focus of the ion beam by varying the intensity of a focusing lens during the ion beam irradiation;
   measuring the intensity of a signal indicating the intensity of the secondary electrons emanating from the sample while the intensity of the focusing lens is being varied; and
   making a focal adjustment of the ion beam on the basis of the intensity of the focusing lens obtained when the measured intensity of the signal indicating secondary electrons is minimal.

* * * * *